(12) United States Patent
Chen

(10) Patent No.: US 9,251,887 B2
(45) Date of Patent: Feb. 2, 2016

(54) STATIC RANDOM ACCESS MEMORY SYSTEM AND OPERATION METHOD THEREOF

(71) Applicant: Etron Technology, Inc., Hsinchu (TW)

(72) Inventor: Chien-Chou Chen, Changhua County (TW)

(73) Assignee: Etron Technology, Inc., Hsinchu (TW)

( * ) Notice: Subject to any disclaimer, the term of this patent is extended or adjusted under 35 U.S.C. 154(b) by 99 days.

(21) Appl. No.: 13/972,915

(22) Filed: Aug. 22, 2013

(65) Prior Publication Data

US 2014/0355335 A1    Dec. 4, 2014

(30) Foreign Application Priority Data

May 30, 2013    (TW) .............................. 102119210 A

(51) Int. Cl.
*G11C 11/419*    (2006.01)

(52) U.S. Cl.
CPC ..................................... *G11C 11/419* (2013.01)

(58) Field of Classification Search
CPC .................................................... G11C 11/419
USPC .......... 365/154, 156, 189.02, 189.04, 189.05, 365/230.05; 257/903
See application file for complete search history.

(56) References Cited

U.S. PATENT DOCUMENTS

| | | | | |
|---|---|---|---|---|
| 5,677,889 A * | 10/1997 | Haraguchi | ................ | G11C 5/14 365/189.09 |
| 5,808,933 A * | 9/1998 | Ross, Jr. | ................ | G11C 11/419 365/154 |
| 6,128,693 A * | 10/2000 | Kim | ................... | G11B 20/1813 711/5 |
| 6,144,604 A * | 11/2000 | Haller | ................... | G11C 7/1075 365/189.07 |
| 6,320,794 B1 * | 11/2001 | Kang | ................... | G11C 7/1012 365/189.02 |
| 2005/0057976 A1 * | 3/2005 | Joo | ........................ | G11C 7/1006 365/189.05 |
| 2007/0019478 A1 * | 1/2007 | Kajimoto | ........... | G11C 16/3459 365/185.22 |
| 2007/0019481 A1 * | 1/2007 | Park | ..................... | G11C 7/1045 365/193 |
| 2007/0177431 A1 * | 8/2007 | Matsunaga | ........ | G11C 16/3427 365/185.26 |
| 2009/0070637 A1 * | 3/2009 | Van Acht | ............ | G06F 11/1068 714/52 |
| 2010/0157717 A1 * | 6/2010 | Lee | ...................... | G11C 7/1027 365/230.08 |
| 2011/0261615 A1 * | 10/2011 | Choi | .................. | G11C 13/0004 365/163 |
| 2014/0153349 A1 * | 6/2014 | Wu | ...................... | G11C 7/1039 365/203 |

OTHER PUBLICATIONS

"behind." Merriam-Webster.com. 2014. http://www.merriam-webster.com (Dec. 12, 2014).*

(Continued)

*Primary Examiner* — Vu Le
*Assistant Examiner* — Sung Cho
(74) *Attorney, Agent, or Firm* — Winston Hsu; Scott Margo

(57) ABSTRACT

A static random access memory system includes a static random access memory, a multiplexer, an input buffer, an output buffer, and a shifter. The input buffer writes write data stored in the input buffer to addresses of the static random access memory corresponding to a write address signal according to a write command. The output buffer reads read data of addresses of the static random access memory corresponding to a read address signal according to a read command. The multiplexer transmits the write address signal and the read address signal to the static random access memory, and generates the write command and the read command. The shifter shifts the write command to an operation clock behind the read command when the write command and the read command exist simultaneously.

15 Claims, 9 Drawing Sheets

(56) References Cited

OTHER PUBLICATIONS

Rahman et al., "Cell Drop Threshold Architecture for Multi-Class Shared Buffer with Finite Memory Size", 2011 International Conference on Computer Application and Industrial Electronics (ICCAIE 2011), pp. 319-324, 2011.*

Rahman et al., Cell Drop Threshold Architecture for Multi-Class Shared Buffer with Finite Memory Size, 2011, ICCAIE 2011, pp. 319-324.*

* cited by examiner

STATIC RANDOM ACCESS MEMORY SYSTEM AND OPERATION METHOD THEREOF

BACKGROUND OF THE INVENTION

1. Field of the Invention

The present invention relates to a static random access memory system and an operation method thereof, and particularly to a static random access memory system and an operation method thereof that have a static random access memory having only one input/output port.

2. Description of the Prior Art

In the prior art, because a static random access memory having two input/output ports can receive a write address signal, a write enable signal, an enable signal, and a read address signal, data from an external data source (e.g. a flash memory) can be written to the static random access memory through one input/output port of the two input/output ports according to the write address signal, the write enable signal, the enable signal, and a host can read corresponding data of the static random access memory through the other input/output port of the two input/output ports according to the read address signal and the enable signal. That is to say, the external data source and the host can execute write data operation and read data operation on the static random access memory through the two input/output ports of the static random access memory simultaneously.

However, chip area of the static random access memory having two input/output ports is larger, so cost of the static random access memory having two input/output ports is higher. Therefore, how to reduce the chip area of the static random access memory having two input/output ports is an important issue for a static random access memory designer.

SUMMARY OF THE INVENTION

An embodiment provides a static random access memory system. The static random access memory system includes a static random access memory, a multiplexer, an input buffer, an output buffer, and a shifter. The input buffer is coupled to the input/output port for writing write data stored in the input buffer to addresses of the static random access memory corresponding to a write address signal according to a write command. The output buffer is coupled to the input/output port for reading read data of addresses of the static random access memory corresponding to a read address signal according to a read command, and outputting the read data to a host. The multiplexer is coupled to the static random access memory, the input buffer, and the output buffer for receiving a write enable signal, an enable signal, the write address signal, and the read address signal, transmitting the write address signal and the read address signal to the static random access memory, generating the write command according to the write enable signal and the enable signal, and generating the read command according to the enable signal. The shifter is coupled to the input buffer and the multiplexer for shifting the write command to an operation clock behind the read command when the write command and the read command exist simultaneously.

Another embodiment provides an operation method of a static random access memory system, where the static random access memory system includes a static random access memory, a multiplexer, an input buffer, an output buffer, and a shifter. The operation method includes the multiplexer receiving a write enable signal, an enable signal, a write address signal, and a read address signal; the multiplexer transmitting the write address signal and the read address signal to the static random access memory, generating a write command according to the write enable signal and the enable signal, and generating a read command according to the enable signal; the input buffer writing write data stored in the input buffer to addresses of the static random access memory corresponding to the write address signal according to the write command; the output buffer reading read data of addresses of the static random access memory corresponding to the read address signal according to the read command, and outputting the read data to a host; and the shifter shifting the write command to an operation clock behind the read command when the write command and the read command exist simultaneously.

The present invention provides a static random access memory system and an operation method thereof. The static random access memory system and the operation method utilize an input buffer having size larger than data width of read data and write data and an output buffer having size larger than the data width of the read data and the write data to execute write data operation and read data operation on a static random access memory (only has one input/output port) at different time points, respectively. In addition, because a handshake process does not exist between the input buffer, the output buffer, and the static random access memory, the shifter can shift a write command to an operation clock behind a read command when the write command and the read command exist simultaneously. Therefore, the shifter can prevent the input buffer and the output buffer from executing the write data operation and the read data operation on the static random access memory simultaneously. Thus, compared to the prior art, because the shifter can prevent the input buffer and the output buffer from executing the write data operation and the read data operation on the static random access memory simultaneously, although the static random access memory provided by the present invention only has one input/output port, the present invention can still provide a read data function in time for a user. Therefore, the present invention not only can provide the read data function in time for the user, but can also reduce chip area of the static random access memory significantly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
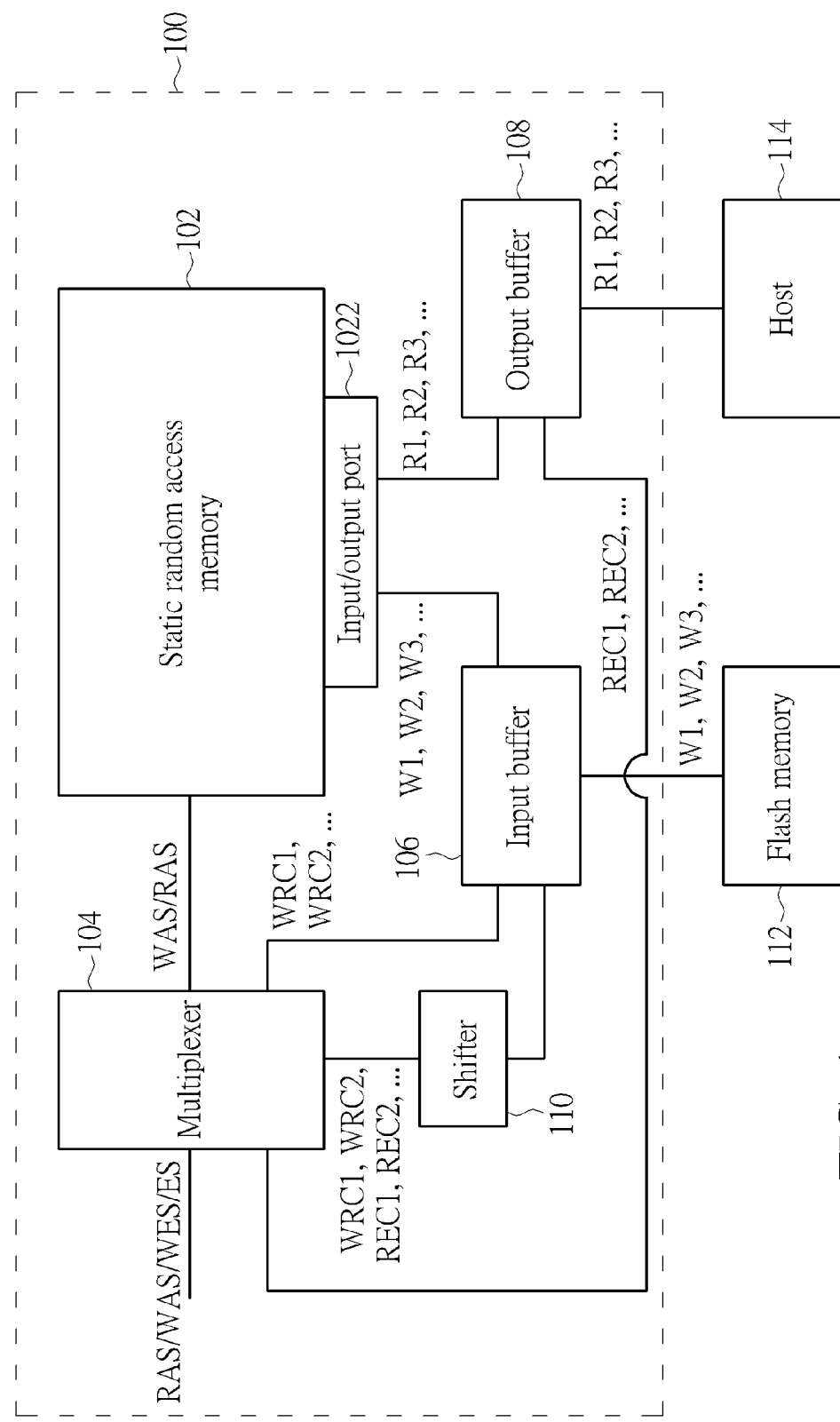
FIG. 1 is a diagram illustrating a static random access memory system according to an embodiment.

Please refer to FIG. 1. FIG. 1 is a diagram illustrating a static random access memory system 100 according to an embodiment, where the static random access memory system 100 includes a static random access memory 102, a multiplexer 104, an input buffer 106, an output buffer 108, and a shifter 110. As shown in FIG. 1, the static random access memory 102 has an input/output port 1022. The multiplexer 104 is coupled to the static random access memory 102, the input buffer 106, and the output buffer 108 for receiving a write enable signal WES, an enable signal ES, a write address signal WAS, and a read address signal RAS, transmitting the write address signal WAS or the read address signal RAS to the static random access memory 102, generating a write command according to the write enable signal WES and the enable signal ES, and generating a read command according to the enable signal ES. The input buffer 106 is coupled to the input/output port 1022 of the static random access memory 102 and the multiplexer 104, where size of the input buffer 106 is at least 2*N bits and N is a positive integer. For example, the size of the input buffer 106 is 2*8 bits. But, the present invention is not limited to the size of the input buffer 106 being 2*8 bits. The input buffer 106 is used for receiving N-bit (e.g. 8-bit) write data from a flash memory 112. But, the present invention is not limited to write data from the flash memory 112 being 8-bit, and also not limited to the input buffer 106 receiving the write data from the flash memory 112. Because the size of the input buffer 106 is 2*8 bits, the input buffer 106 can store two 8-bit write data. Therefore, when the input buffer 106 receives the write command, the input buffer 106 writes write data (that is, two 8-bit write data) stored in the input buffer 106 to address of the static random access memory 102 corresponding to the write address signal WAS at a time through the input/output port 1022 according to the write command. The output buffer 108 is coupled to the static random access memory 102 and the multiplexer 104, and the size of the output buffer 108 is 2*8 bits the same as the size of the input buffer 106. Because the size of the output buffer 108 is 2*8 bits, the output buffer 108 can also store two 8-bit read data. Therefore, when the output buffer 108 receives the read command, the output buffer 108 reads read data (that is, two 8-bit read data) of addresses of the static random access memory 102 corresponding to the read address signal RAS at a time through the input/output port 1022 according to the read command, and outputs the two 8-bit read data to a host 114. Because a handshake process does not exist between the input buffer 106, the output buffer 108, and the static random access memory 102, the shifter 110 can shift the write command to an operation clock behind the read command when the write command and the read command exist simultaneously. Therefore, although the static random access memory 102 only has the input/output port 1022, the shifter 110 can prevent the input buffer 106 and the output buffer 108 from executing write data operation and read data operation on the static random access memory 102 simultaneously.

Figure 2:
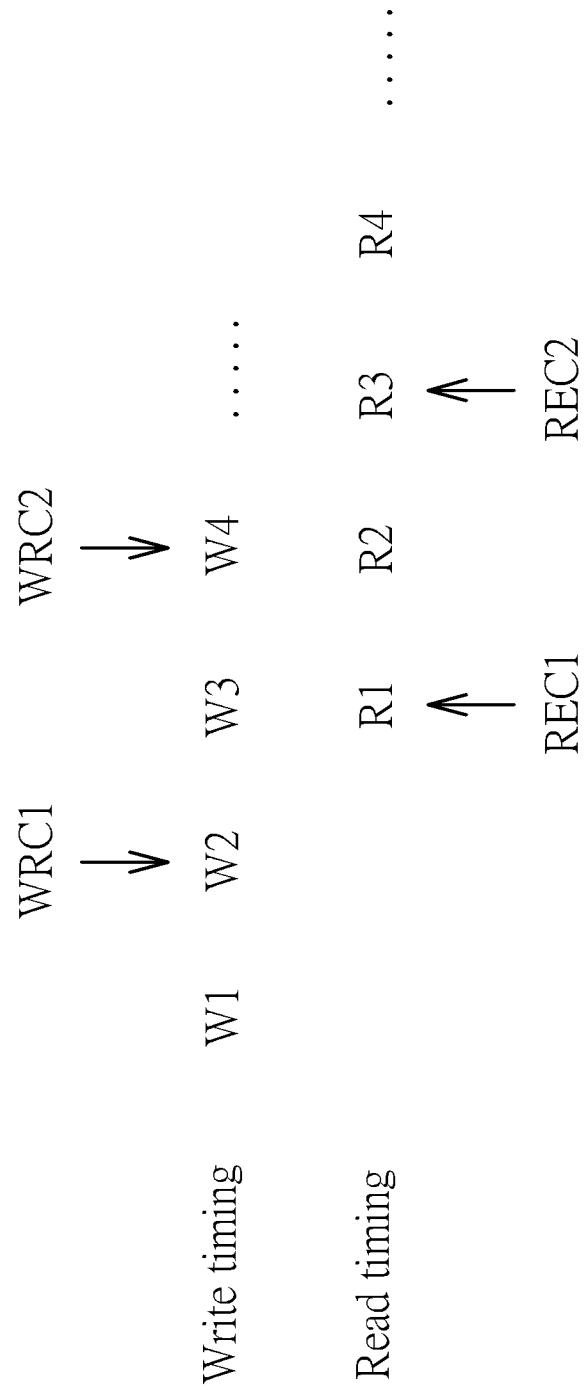
FIG. 2 is a diagram illustrating a write timing and a read timing of the static random access memory system.
Figure 3:
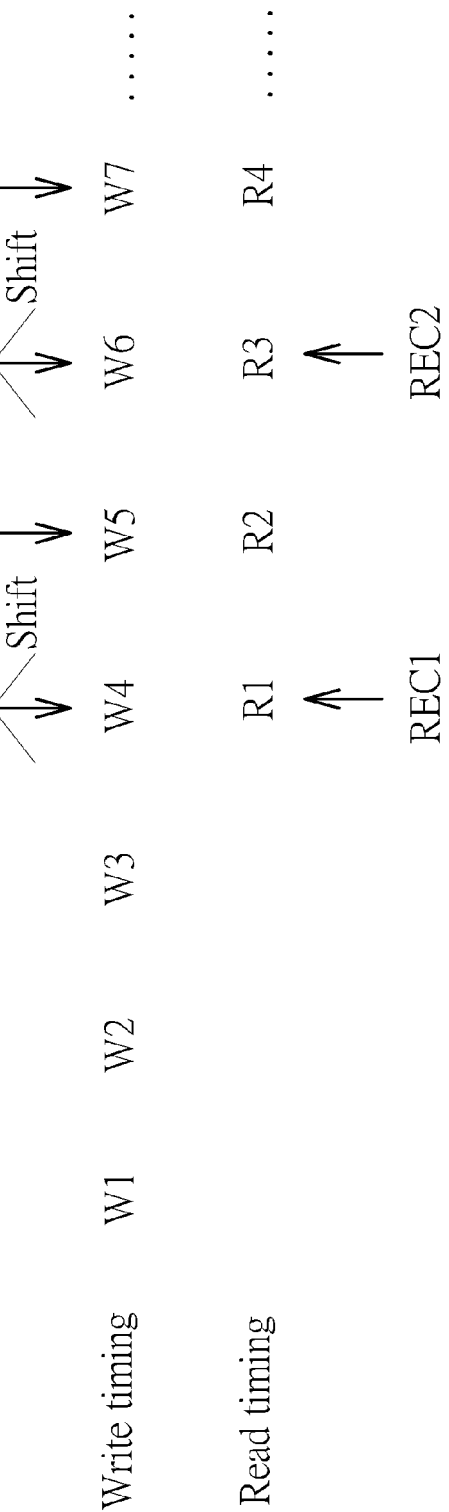
FIG. 3 is a diagram illustrating the write timing and the read timing of the static random access memory system when the write command and the read command exist simultaneously.

Please refer to FIG. 2 and FIG. 3. FIG. 2 is a diagram illustrating a write timing and a read timing of the static random access memory system 100, and FIG. 3 is a diagram illustrating the write timing and the read timing of the static random access memory system 100 when the write command and the read command exist simultaneously. As shown in FIG. 2, when the input buffer 106 receives two 8-bit write data W1, W2 from the flash memory 112 (meanwhile, the input buffer 106 stores new 8-bit write data (that is, the two 8-bit write data W1, W2)), the multiplexer 104 can generate a write command WRC1 to the input buffer 106 according to the write enable signal WES and the enable signal ES. Meanwhile, the input buffer 106 can write the two 8-bit write data W1, W2 stored in the input buffer 106 at a time to address of the static random access memory 102 corresponding to the write address signal WAS through the input/output port 1022 according to the write command WRC1. Similarly, when the input buffer 106 receives two 8-bit write data W3, W4 from the flash memory 112 (meanwhile, the input buffer 106 stores new 8-bit write data (that is, the two 8-bit write data W3, W4)), the multiplexer 104 can generate a write command WRC2 to the input buffer 106 according to the write enable signal WES and the enable signal ES. Meanwhile, the input buffer 106 can write the two 8-bit write data W3, W4 stored in the input buffer 106 at a time to address of the static random access memory 102 corresponding to the write address signal WAS through the input/output port 1022 according to the write command WRC2.

As shown in FIG. 2, when the host 114 notifies the static random access memory system 100 to start to execute to read data, the multiplexer 104 can generate a read command REC1 to the output buffer 108 according to the enable signal ES. Meanwhile, the output buffer 108 can read two 8-bit read data R1, R2 of addresses of the static random access memory 102 corresponding to the read address signal RAS at a time through the input/output port 1022 according to the read command REC1. Similarly, the multiplexer 104 can generate a read command REC2 to the output buffer 108 according to the enable signal ES. Meanwhile, the output buffer 108 can read two 8-bit read data R3, R4 of addresses of the static random access memory 102 corresponding to the read address signal RAS at a time through the input/output port 1022 according to the read command REC2.

As shown in FIG. 3, because a handshake process does not exist between the input buffer 106, the output buffer 108, and the static random access memory 102, when the write command WRC1 and the read command REC1 exist simultaneously, the shifter 110 can shift the write command WRC1 to an operation clock behind the read command REC1. Therefore, the input buffer 106 can write the two 8-bit write data W3, W4 stored in the input buffer 106 at a time to the address of the static random access memory 102 corresponding to the write address signal WAS through the input/output port 1022 according to the shifted write command WRC1. In addition, the output buffer 108 can read the two 8-bit read data R1, R2 of the addresses of the static random access memory 102 corresponding to the read address signal RAS at a time through the input/output port 1022 according to the read command REC1. Similarly, because the write command WRC2 and the read command REC2 exist simultaneously, the shifter 110 can shift the write command WRC2 to an operation clock behind the read command REC2. Therefore, the input buffer 106 can write two 8-bit write data W5, WE stored in the input buffer 106 at a time to address of the static random access memory 102 corresponding to the write address signal WAS through the input/output port 1022 according to the shifted write command WRC2. In addition, the output buffer 108 can read the two 8-bit read data R3, R4 of the addresses of the static random access memory 102 corresponding to the read address signal RAS at a time through the input/output port 1022 according to the read command REC2.

Figure 4:
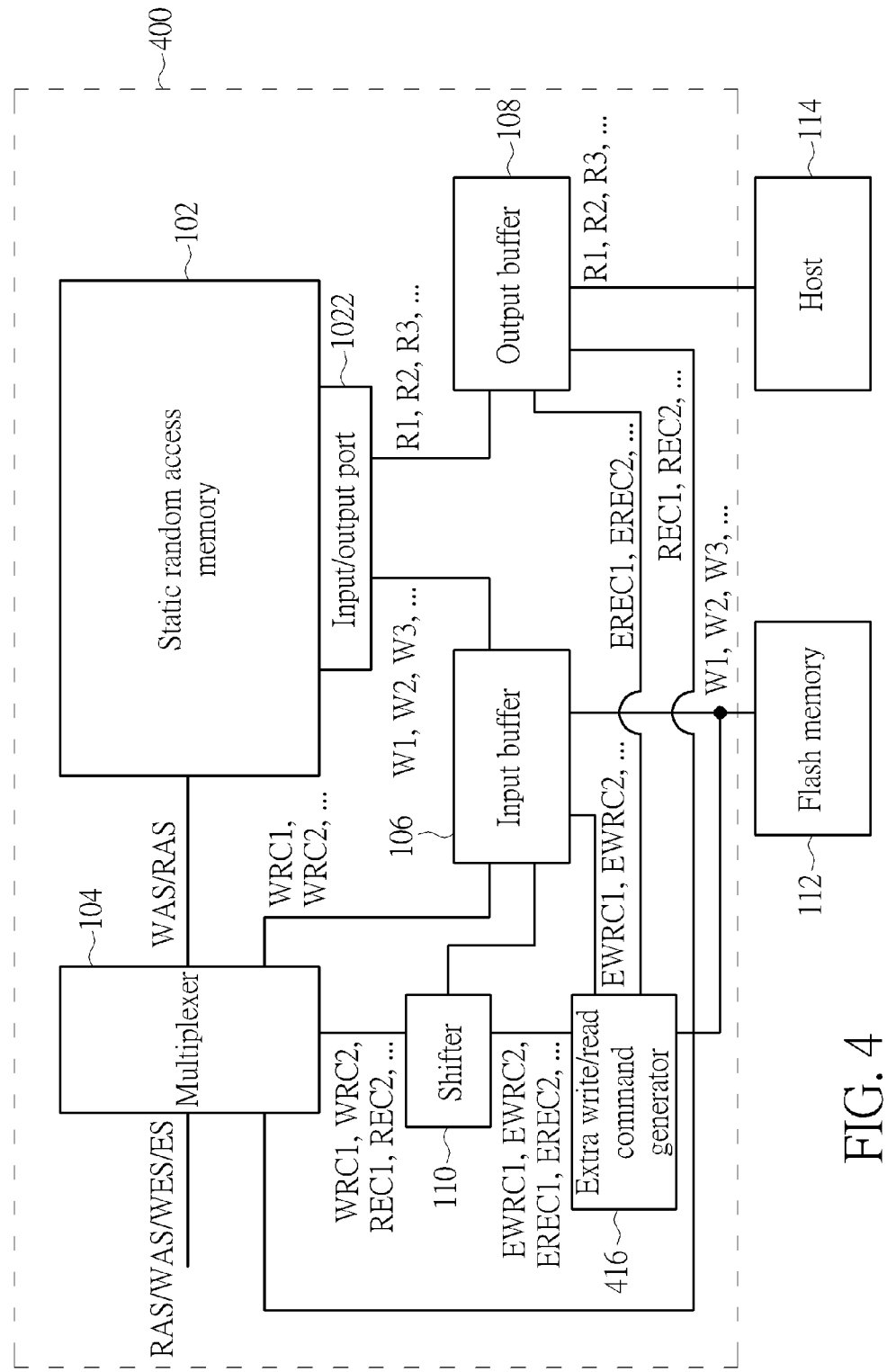
FIG. 4 is a diagram illustrating a static random access memory system according to another embodiment.

Please refer to FIG. 4. FIG. 4 is a diagram illustrating a static random access memory system 400 according to another embodiment. As shown in FIG. 4, a difference between the static random access memory system 400 and the static random access memory system 100 is that the static random access memory system 400 further includes an extra write/read command generator 416, where the extra write/read command generator 416 is used for generating an extra write command after a last N-bit write datum of a write datum group when a plurality of N-bit (e.g. 8-bit) write data are included in the write datum group, and generating an extra read command before a first N-bit read datum of a read datum group when a plurality of N-bit (e.g. 8-bit) read data are included in the read datum group. In addition, in the static random access memory system 400, size of the input buffer 106 and size of the output buffer 108 are at least 4*N bits, where the size of the output buffer 108 and the size of the input buffer 106 are the same as 4*N bits, and N is a positive integer. For example, in the static random access memory system 400, the size of the output buffer 108 and the size of the input buffer 106 are 4*8 bits. But, the present invention is not limited to the size of the output buffer 108 and the size of the input buffer 106 of the static random access memory system 400 being 4*8 bits.

Figure 5:
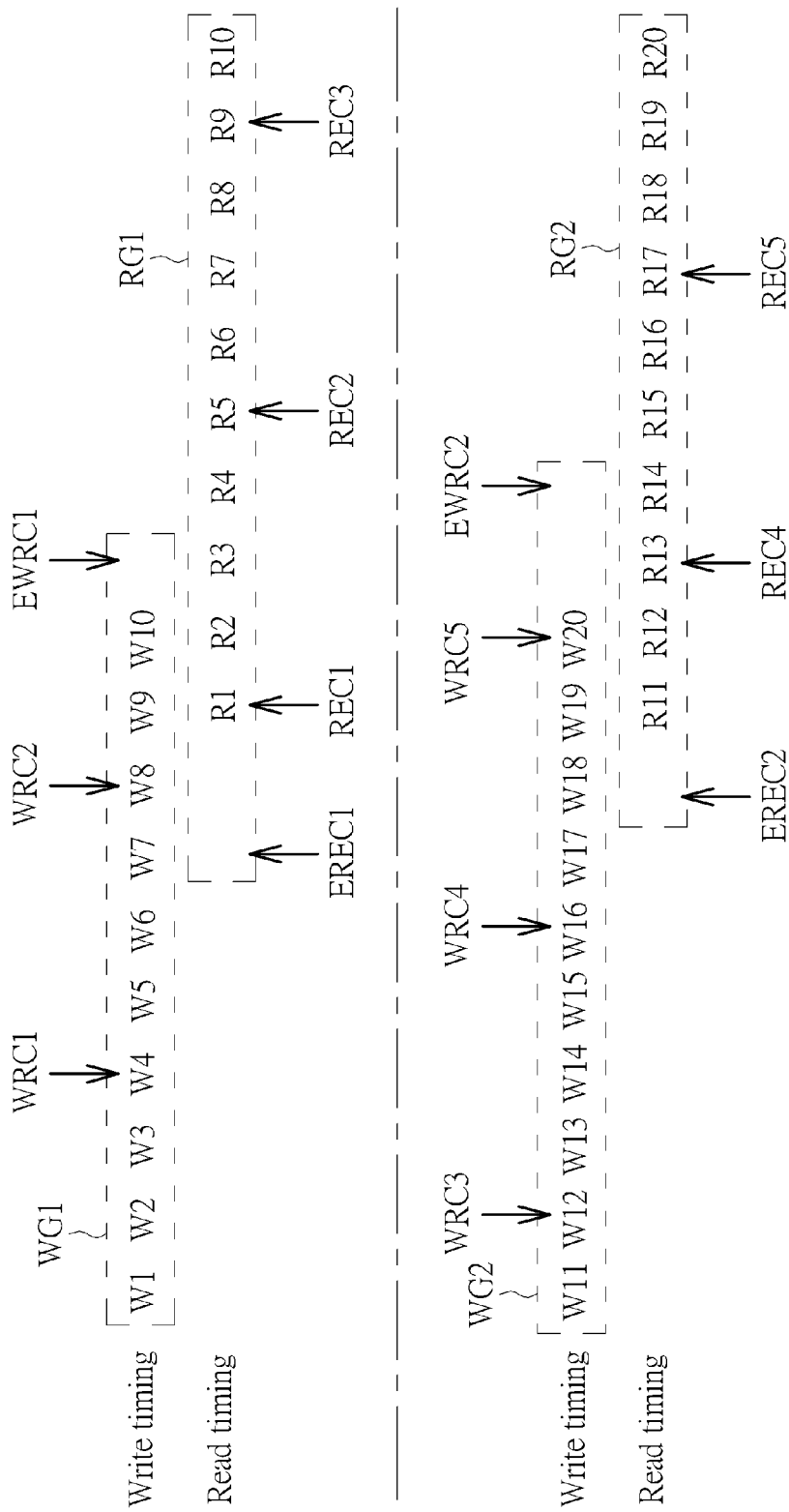
FIG. 5 is a diagram illustrating a write timing and a read timing of the static random access memory system.
Figure 6:
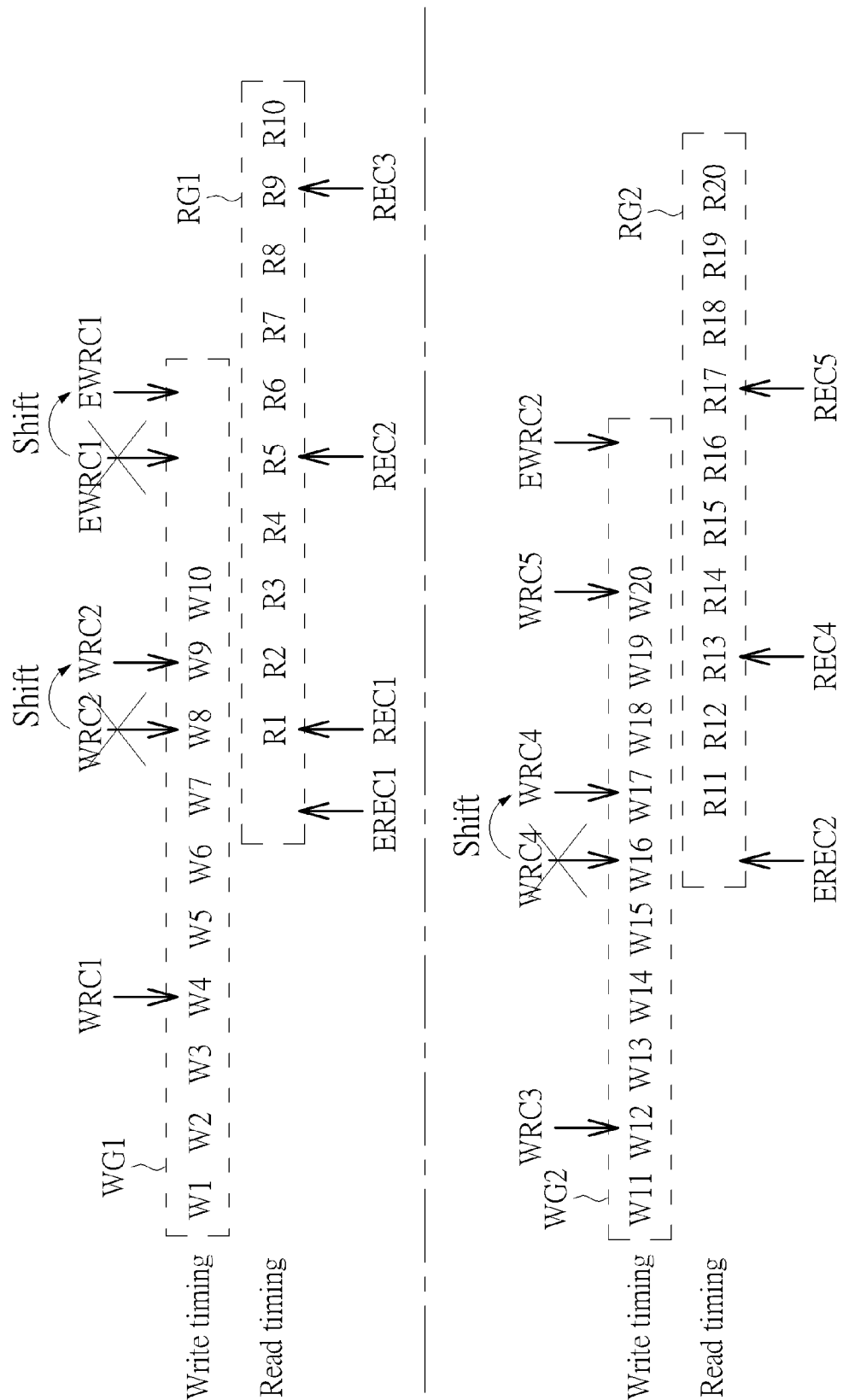
FIG. 6 is a diagram illustrating the write timing and the read timing of the static random access memory system when the extra write command and the read command exist simultaneously.

Please refer to FIG. 5 and FIG. 6. FIG. 5 is a diagram illustrating a write timing and a read timing of the static random access memory system 400, and FIG. 6 is a diagram illustrating the write timing and the read timing of the static random access memory system 400 when the extra write command and the read command exist simultaneously. As shown in FIG. 5, 8-bit write data W1-W10 are included in a first write datum group WG1, 8-bit write data W11-W20 are included in a second write datum group WG2, 8-bit read data R1-R10 are included in a first read datum group RG1, and 8-bit read data R11-R20 are included in a second read datum group RG2. But, the present invention is not limited to number of write data of the first write datum group WG1 and the second write datum group WG2 and number of read data of the first read datum group RG1 and the second read datum group RG2 in FIG. 5. In addition, the first write datum group WG1, the second write datum group WG2, the first read datum group RG1, and the second read datum group RG2 are applied to an error correction engine decoder. But, the present invention is not limited to the first write datum group WG1, the second write datum group WG2, the first read datum group RG1, and the second read datum group RG2 being applied to an error correction engine decoder. That is to say, the first write datum group WG1, the second write datum group WG2, the first read datum group RG1, and the second read datum group RG2 can also be applied an application needing to read data in time.

As shown in FIG. 5, when the input buffer 106 receives four 8-bit write data W1-W4 of the first write datum group WG1 from the flash memory 112 (meanwhile, the input buffer 106 stores new 8-bit write data (that is, the four 8-bit write data W1-W4)), the multiplexer 104 can generate a write command WRC1 to the input buffer 106 according to the write enable signal WES and the enable signal ES. Meanwhile, the input buffer 106 can write the four 8-bit write data W1-W4 stored in the input buffer 106 at a time to address of the static random access memory 102 corresponding to the write address signal WAS through the input/output port 1022 according to the write command WRC1. Similarly, when the input buffer 106 receives four 8-bit write data W5-W8 of the first write datum group WG1 from the flash memory 112 (meanwhile, the input buffer 106 stores new 8-bit write data (that is, the four 8-bit write data W5-W8)), the multiplexer 104 can generate a write command WRC2 to the input buffer 106 according to the write enable signal WES and the enable signal ES. Meanwhile, the input buffer 106 can write the four 8-bit write data W5-W8 stored in the input buffer 106 at a time to address of the static random access memory 102 corresponding to the write address signal WAS through the input/output port 1022 according to the write command WRC2. In addition, when the input buffer 106 receives a last 8-bit write datum W10 of the first write datum group WG1 from the flash memory 112 (meanwhile, only a half of the size of input buffer 106 are occupied by new 8-bit write data W9, W10), the extra write/read command generator 416 generates an extra write command EWRC1 to the input buffer 106 after the 8-bit write datum W10 to force the last two 8-bit write data W9, W10 of the first write datum group WG1 to be written to the static random access memory system 400. Meanwhile, the input buffer 106 can write the two 8-bit write data W9, W10 stored in the input buffer 106 at a time to address of the static random access memory 102 corresponding to the write address signal WAS through the input/output port 1022 according to the extra write command EWRC1.

When the input buffer 106 from the flash memory 112 receives two 8-bit write data W11, W12 of the second write datum group WG2 (meanwhile, the input buffer 106 stores 8-bit write data (that is, the four 8-bit write data W9-W12), so the size of input buffer 106 are all occupied), the multiplexer 104 can generate a write command WRC3 to the input buffer 106 according to the write enable signal WES and the enable signal ES. Meanwhile, the input buffer 106 can write the two 8-bit write data W11, W12 stored in the input buffer 106 at a time to address of the static random access memory 102 corresponding to the write address signal WAS through the input/output port 1022 according to the write command WRC3. Similarly, operational principles of four 8-bit write data W13-W16 of the second write datum group WG2 and a write command WRC4 are the same as those of the four 8-bit write data W1-W4 of the first write datum group WG1 and the write command WRC1, so further description thereof is omitted for simplicity. In addition, when the input buffer 106 receives four 8-bit write data W17-W20 of the second write datum group WG2 from the flash memory 112 (meanwhile, the input buffer 106 stores new 8-bit write data (that is, the 8-bit write data W17-W20)), the multiplexer 104 can generate a write command WRC5 to the input buffer 106 according to the write enable signal WES and the enable signal ES. Meanwhile, the input buffer 106 can write the four 8-bit write data W17-W20 stored in the input buffer 106 at a time to address of the static random access memory 102 corresponding to the write address signal WAS through the input/output port 1022 according to the write command WRC5. Although the input buffer 106 can write the four 8-bit write data W17-W20 stored in the input buffer 106 at a time to the static random access memory 102 through the input/output port 1022 according to the write command WRC5, the extra write/read command generator 416 can still generate an extra write command EWRC2 to the input buffer 106 8-bit after the last 8-bit write datum W20 when the input buffer 106 receives the last 8-bit write datum W20 of the second write datum group WG2 from the flash memory 112.

As shown in FIG. 5, when the host 114 notifies the static random access memory system 400 to start to execute to read data, the extra write/read command generator 416 can generate an extra read command EREC1 to the output buffer 108 before a first 8-bit read datum R1 of the first read datum group RG1, and the multiplexer 104 can generate a read command REC1 to the output buffer 108 according to the enable signal ES. Meanwhile, the output buffer 108 can read four 8-bit read data R1-R4 of addresses of the static random access memory 102 corresponding to the read address signal RAS at a time through the input/output port 1022 according to the read command REC1, and output the four 8-bit read data R1-R4 to the host 114. Similarly, the multiplexer 104 can generate a read command REC2 to the output buffer 108 according to the enable signal ES. Meanwhile, the output buffer 108 can read four 8-bit read data R5-R8 of addresses of the static random access memory 102 corresponding to the read address signal RAS at a time through the input/output port 1022 according to the read command REC2, and output the four 8-bit read data R5-R8 to the host 114. In addition, the multiplexer 104 can generate a read command REC3 to the output buffer 108 according to the enable signal ES. Meanwhile, because two remaining 8-bit read data R9, R10 of the first read datum group RG1 are not yet read, the output buffer 108 only can read the two 8-bit read data R9, R10 of addresses of the static random access memory 102 corresponding to the read address signal RAS at a time through the input/output port 1022 according to the read command REC3, and outputs the two 8-bit read data R9, R10 to the host 114.

As shown in FIG. 5, the extra write/read command generator 416 can generate an extra read command EREC2 to the output buffer 108 before a first 8-bit read datum R11 of the second read datum group RG2. Meanwhile, the output buffer 108 can read two 8-bit read data R11, R12 of addresses of the static random access memory 102 corresponding to the read address signal RAS at a time through the input/output port 1022 according to the extra read command EREC2, and output the two 8-bit read data R11, R12 to the host 114. Similarly, operational principles of four 8-bit read data R13-R16 of the second read datum group RG2 and a read command REC4, and four 8-bit read data R17-R20 of the second read datum group RG2 and a read command REC5 are the same as those of the four 8-bit read data R1-R4 of the first read datum group RG1 and the read command REC1, so further description thereof is omitted for simplicity.

As shown in FIG. 6, because a handshake process does not exist between the input buffer 106, the output buffer 108, and the static random access memory 102, the shifter 110 can shift the write command WRC2 to an operation clock behind the read command REC1 when the write command WRC2 and the read command REC1 exist simultaneously. Therefore, the input buffer 106 can write the four write data W5-W8 stored in the input buffer 106 at a time to the address of the static random access memory 102 corresponding to the write address signal WAS through the input/output port 1022 according to the shifted write command WRC2. Similarly, because the extra write command EWRC1 and the read command REC2 exist simultaneously, the shifter 110 can shift the extra write command EWRC1 to an operation clock behind the read command REC2. Therefore, the input buffer 106 can write the two 8-bit write data W9, W10 stored in the input buffer 106 at a time to the address of the static random access memory 102 corresponding to the write address signal WAS through the input/output port 1022 according to the shifted extra write command EWRC1. Similarly, because the write command WRC4 and the extra read command EREC2 exist simultaneously, the shifter 110 can shift the write command WRC4 to an operation clock behind the extra read command EREC2. Therefore, the input buffer 106 can write the four 8-bit write data W13-W16 stored in the input buffer 106 at a time to the address of the static random access memory 102 corresponding to the write address signal WAS through the input/output port 1022 according to the shifted write command WRC4.

Figure 7:
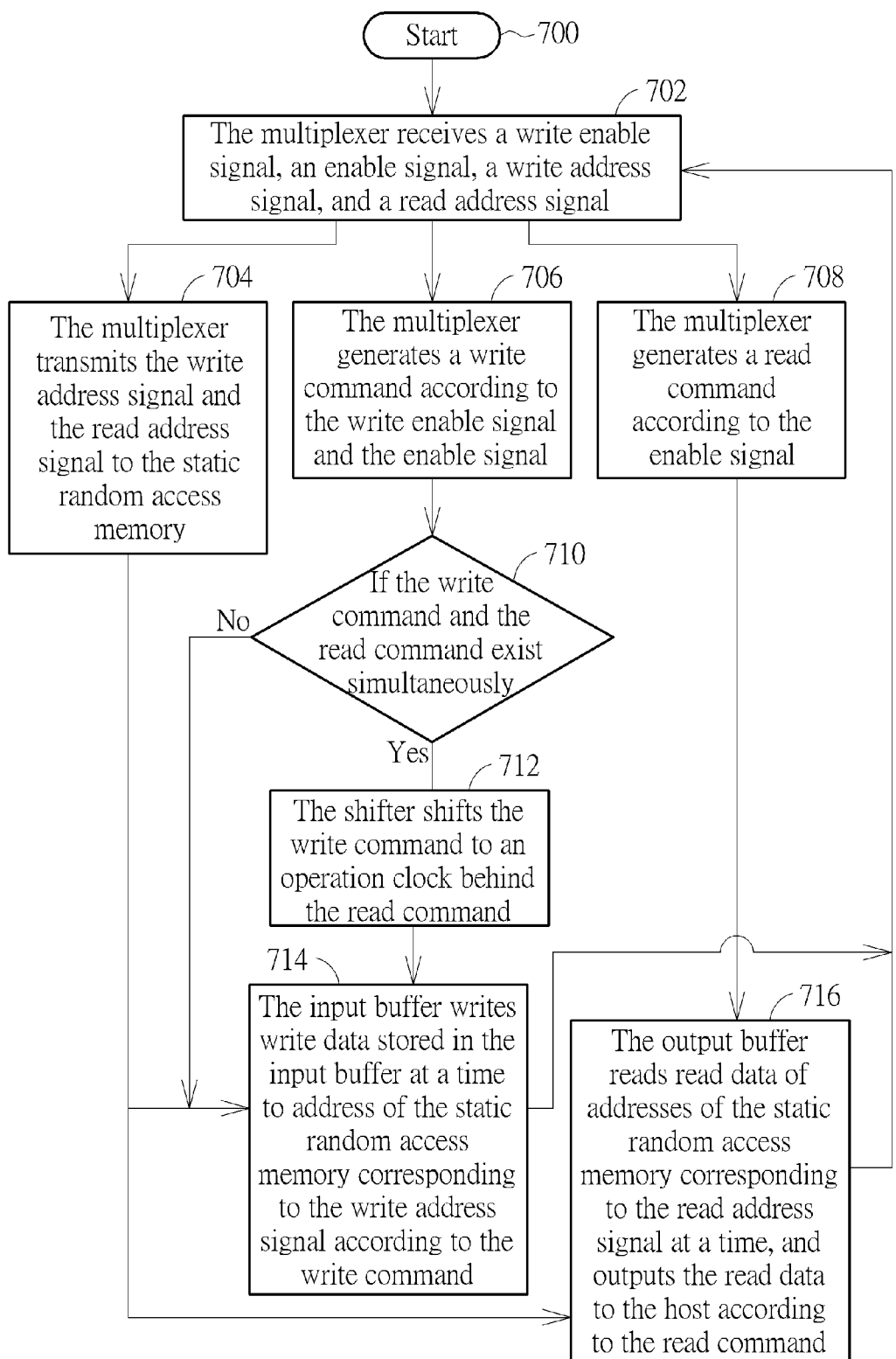
FIG. 7 is a flowchart illustrating an operation method of a static random access memory system according to another embodiment.

Please refer to FIG. 1, FIG. 2, FIG. 3, and FIG. 7. FIG. 7 is a flowchart illustrating an operation method of a static random access memory system according to another embodiment. The operation method in FIG. 7 is illustrated using the static random access memory system 100 in FIG. 1. Detailed steps are as follows:

Step 700: Start.

Step 702: The multiplexer 104 receives a write enable signal WES, an enable signal ES, a write address signal WAS, and a read address signal RAS.

Step 704: The multiplexer 104 transmits the write address signal WAS and the read address signal RAS to the static random access memory 102.

Step 706: The multiplexer 104 generates a write command according to the write enable signal WES and the enable signal ES, go to Step 710.

Step 708: The multiplexer 104 generates a read command according to the enable signal ES, go to Step 716.

Step 710: If the write command and the read command exist simultaneously; if yes, go to Step 712; if no, go to Step 714.

Step 712: The shifter 110 shifts the write command to an operation clock behind the read command, go to Step 714.

Step 714: The input buffer 106 writes write data stored in the input buffer 106 at a time to address of the static random access memory 102 corresponding to the write address signal WAS according to the write command, go to Step 702.

Step 716: The output buffer 108 reads read data of addresses of the static random access memory 102 corresponding to the read address signal RAS at a time, and outputs the read data to the host 114 according to the read command, go to Step 702.

In Step 710, as shown in FIG. 2, the write command WRC1 generated by the multiplexer 104 does not exist with any read command at the same time, so the write command WRC1 is directly transmitted to the input buffer 106. Therefore, in Step 714, the input buffer 106 can write the two 8-bit write data W1, W2 stored in the input buffer 106 at a time to the address of the static random access memory 102 corresponding to the write address signal WAS through the input/output port 1022 according to the write command WRC1. In addition, operational principles of the write command WRC2 generated by the multiplexer 104 are the same as those of the write command WRC1, so further description thereof is omitted for simplicity.

In Step 708, as shown in FIG. 2, when the host 114 notifies the static random access memory system 400 to start to execute to read data, the multiplexer 104 can generate the read command REC1 to the output buffer 108 according to the enable signal ES. In Step 716, the output buffer 108 can read the two 8-bit read data R1, R2 of the addresses of the static random access memory 102 corresponding to the read address signal RAS at a time through the input/output port 1022 according to the according to read command REC1. In addition, operational principles of a read command REC2 generated by the multiplexer 104 are the same as those of the read command REC1, so further description thereof is omitted for simplicity.

As shown in FIG. 3, in Step 710 and Step 712, because a handshake process does not exist between the input buffer 106, the output buffer 108, and the static random access memory 102, when the write command WRC1 and the read command REC1 exist simultaneously, the shifter 110 can shift the write command WRC1 to an operation clock behind the read command REC1. Therefore, in Step 714, the input buffer 106 can write the two 8-bit write data W3, W4 stored in the input buffer 106 at a time to the address of the static random access memory 102 corresponding to the write address signal WAS through the input/output port 1022 according to the shifted write command WRC1. In addition, in Step 716, the output buffer 108 can read the two 8-bit read data R1, R2 of the addresses of the static random access memory 102 corresponding to the read address signal RAS at a time through the input/output port 1022 according to the read command REC1 In addition, in FIG. 3, operational principles of the write command WRC2 and the read command REC2 generated by the multiplexer 104 are the same as those of the write command WRC1 and the read command REC1, so further description thereof is omitted for simplicity.

Figure 8A:
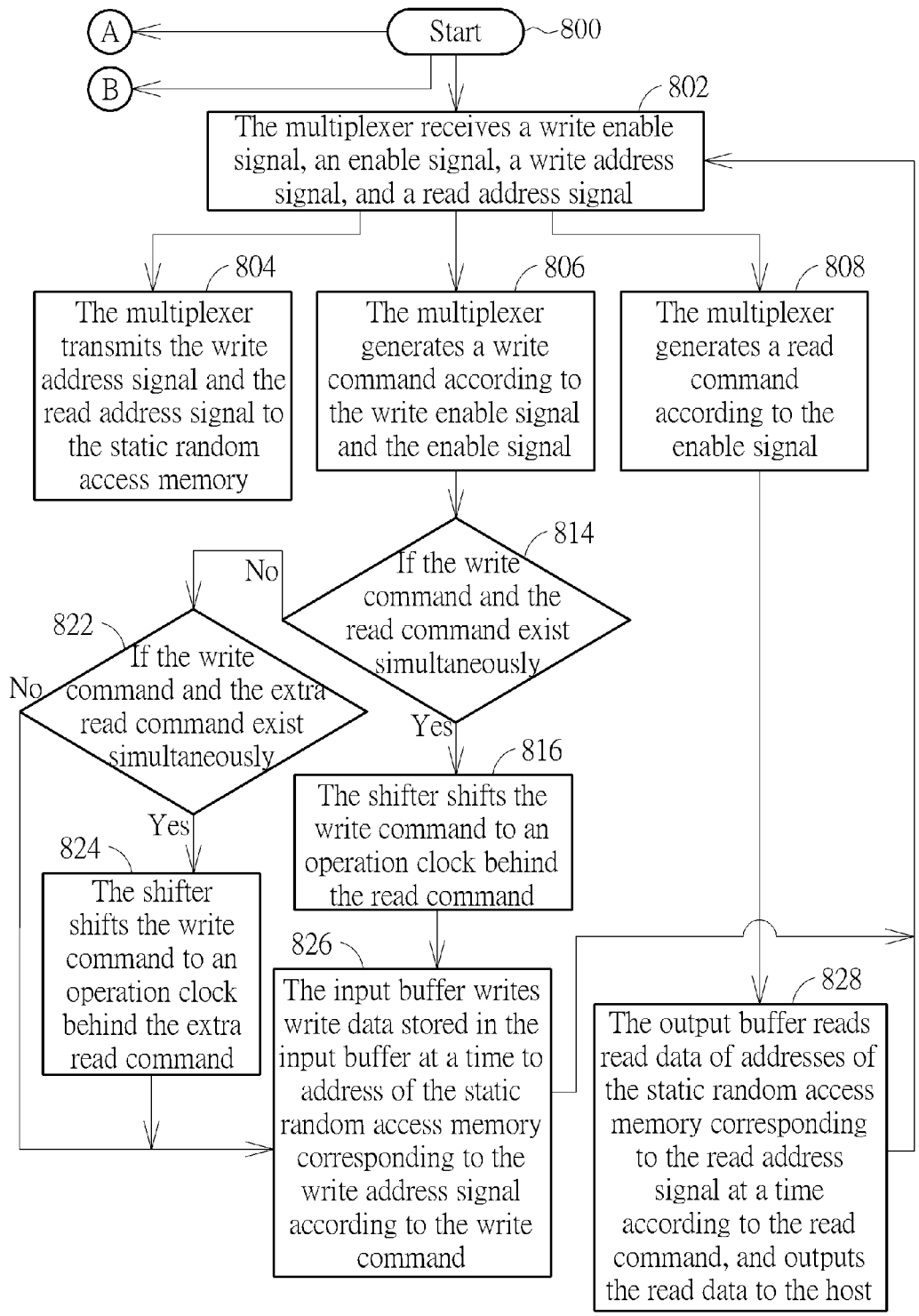
FIG. 8A and FIG. 8B are flowcharts illustrating an operation method of a static random access memory system according to another embodiment.
Figure 8B:
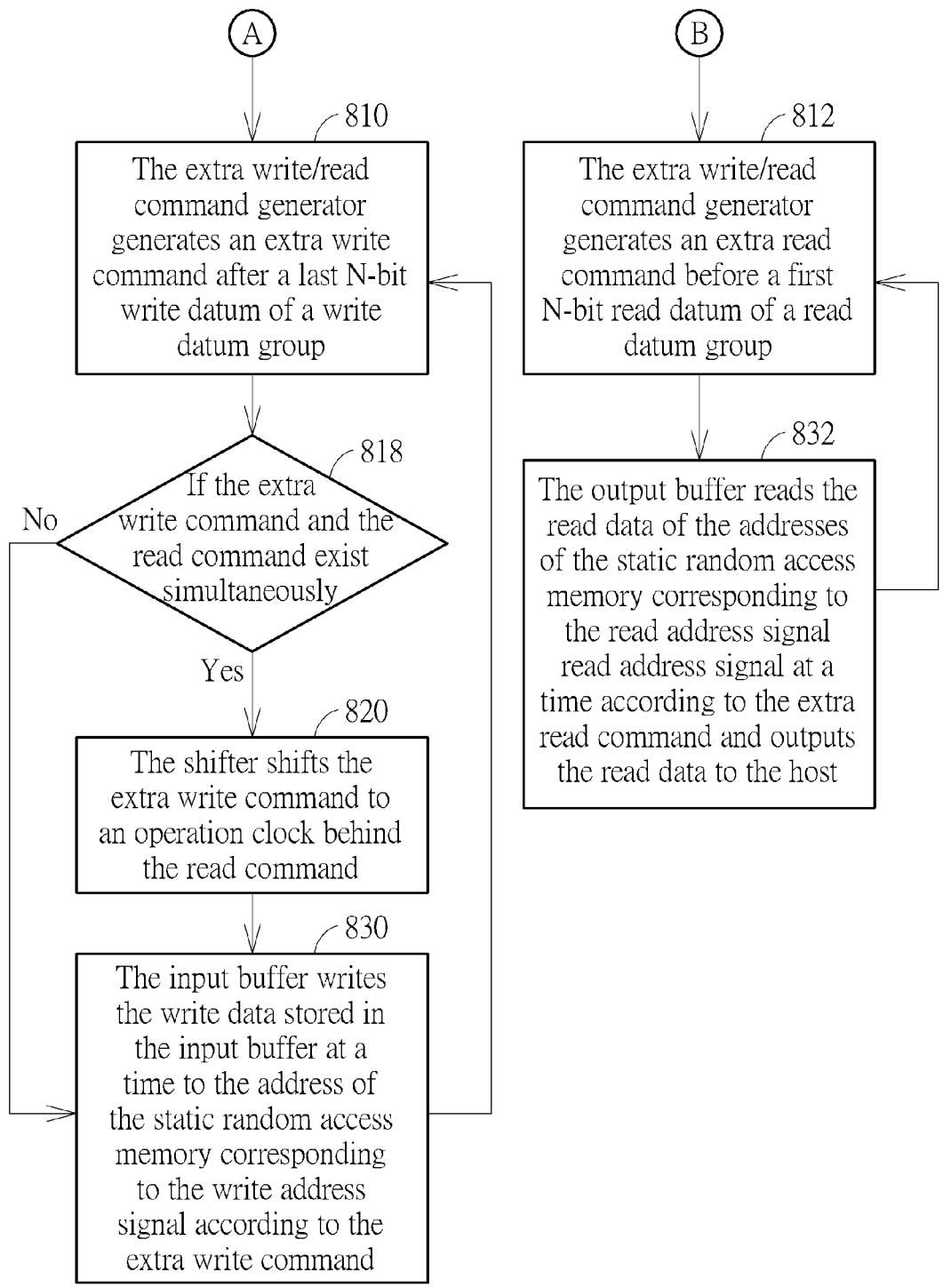

Please refer to FIG. 4, FIG. 5, FIG. 6, FIG. 8A, and FIG. 8B. FIG. 8A and FIG. 8B are flowcharts illustrating an operation method of a static random access memory system according to another embodiment. The operation method in FIG. 8A and FIG. 8B is illustrated using the static random access memory system 400 in FIG. 4. Detailed steps are as follows:

Step 800: Start.

Step 802: The multiplexer 104 receives a write enable signal WES, an enable signal ES, a write address signal WAS, and a read address signal RAS.

Step 804: The multiplexer 104 transmits the write address signal WAS and the read address signal RAS to the static random access memory 102.

Step 806: The multiplexer 104 generates a write command according to the write enable signal WES and the enable signal ES, go to Step 814.

Step 808: The multiplexer 104 generates a read command according to the enable signal ES, go to Step 828.

Step 810: The extra write/read command generator 416 generates an extra write command after a last N-bit write datum of a write datum group, go to Step 818.

Step 812: The extra write/read command generator 416 generates an extra read command before a first N-bit read datum of a read datum group, go to Step 832.

Step 814: If the write command and the read command exist simultaneously; if yes, go to Step 816; if no, go to Step 822.

Step 816: The shifter 110 shifts the write command to an operation clock behind the read command, go to Step 826.

Step 818: If the extra write command and the read command exist simultaneously; if yes, go to Step 820; if no, go to Step 830.

Step 820: The shifter 110 shifts the extra write command to an operation clock behind the read command, go to Step 830.

Step 822: If the write command and the extra read command exist simultaneously; if yes, go to Step 824; if no, go to Step 826.

Step 824: The shifter 110 shifts the write command to an operation clock behind the extra read command, go to Step 826.

Step 826: The input buffer 106 writes write data stored in the input buffer 106 at a time to address of the static random access memory 102 corresponding to the write address signal WAS according to the write command, go to Step 802.

Step 828: The output buffer 108 reads read data of addresses of the static random access memory 102 corresponding to the read address signal RAS at a time according to the read command, and outputs the read data to the host 114, go to Step 802.

Step 830: The input buffer 106 writes the write data stored in the input buffer 106 at a time to the address of the static random access memory 102 corresponding to the write address signal WAS according to the extra write command, go to Step 810.

Step 832: The output buffer 108 reads the read data of the addresses of the static random access memory 102 corresponding to the read address signal read address signal RAS at a time according to the extra read command and outputs the read data to the host 114, go to Step 812.

As shown in FIG. 5, the 8-bit write data W1-W10 are included in the first write datum group WG1, the 8-bit write data W11-W20 are included in the second write datum group WG2, the 8-bit read data R1-R10 are included in the first read datum group RG1, and the 8-bit read data R11-R20 are included in the second read datum group RG2. In addition, the first write datum group WG1, the second write datum group WG2, the first read datum group RG1, and the second read datum group RG2 are applied to an error correction engine decoder. But, the present invention is not limited to the first write datum group WG1, the second write datum group WG2, the first read datum group RG1, and the second read datum group RG2 being applied to an error correction engine decoder.

In Step 806, as shown in FIG. 5, the multiplexer 104 generates the write command WRC1 according to the write enable signal WES and the enable signal ES. In Step 814 and Step 822, the write command WRC1 does not exist with any read command at the same time, and also not exist with any extra read command at the same time, so the write command WRC1 is directly transmitted to the input buffer 106. In Step 826, the input buffer 106 can write the four 8-bit write data W1-W4 stored in the input buffer 106 at a time to the address of the static random access memory 102 corresponding to the write address signal WAS through the input/output port 1022 according to the write command WRC1. In addition, operational principles of the write commands WRC2, WRC3, and WRC4 generated by the multiplexer 104 are the same as those of the write command WRC1, so further description thereof is omitted for simplicity.

In Step 810, when the input buffer 106 receives the last 8-bit write datum W10 of the first write datum group WG1 from the flash memory 112, the extra write/read command generator 416 generates the extra write command EWRC1 to the input buffer 106 after the 8-bit write datum W10. In Step 818, the extra write command EWRC1 does not exist with any read command at the same time, and also not exist with any extra read command at the same time, so the extra write command EWRC1 is directly transmitted to the input buffer 106. Therefore, in Step 830, the input buffer 106 can write the two 8-bit write data W9, W10 stored in the input buffer 106 at a time to the address of the static random access memory 102 corresponding to the write address signal WAS through the input/output port 1022 according to the extra write command EWRC1. In addition, operational principles of the extra write command EWRC2 generated by the extra write/read command generator 416 are the same as those of the extra write command EWRC1, so further description thereof is omitted for simplicity.

In Step 808 and Step 812, as shown in FIG. 5, when the host 114 notifies the static random access memory system 100 to start to execute to read data, the extra write/read command generator 416 can generate the extra read command EREC1 to the output buffer 108 before the first 8-bit read datum R1 of the first read datum group RG1, and the multiplexer 104 can generate the read command REC1 according to the enable signal ES. In Step 828, the output buffer 108 can read the four 8-bit read data R1-R4 of the addresses of the static random access memory 102 corresponding to the read address signal RAS at a time through the input/output port 1022 according to the read command REC1, and output the four 8-bit read data R1-R4 to the host 114. In addition, operational principles of the read commands REC2, REC3, REC4, and REC5 generated by the multiplexer 104 are the same as those of the read command REC1, so further description thereof is omitted for simplicity.

In Step 812, as shown in FIG. 5, the extra write/read command generator 416 can generate the extra read command EREC2 to the output buffer 108 before the first 8-bit read datum R11 of the second read datum group RG2. In Step 832, the output buffer 108 can read the two 8-bit read data R11, R12 of the addresses of the static random access memory 102 corresponding to the read address signal RAS at a time through the input/output port 1022 according to the extra read command EREC2, and output the two 8-bit read data R11, R12 to the host 114.

In Step 814 and Step 816, as shown in FIG. 6, because a handshake process does not exist between the input buffer 106, the output buffer 108, and the static random access memory 102, the shifter 110 can shift the write command WRC2 to an operation clock behind the read command REC1 when the write command WRC2 and the read command REC1 exist simultaneously. Therefore, in Step 826, the input buffer 106 can write the four write data W5-W8 stored in the input buffer 106 at a time to the address of the static random access memory 102 corresponding to the write address signal WAS through the input/output port 1022 according to the shifted write command WRC2.

In Step 818 and Step 820, because the extra write command EWRC1 and the read command REC2 exist simultaneously, the shifter 110 can shift the extra write command EWRC1 to an operation clock behind the read command REC2. Therefore, in Step 830, the input buffer 106 can write the two 8-bit write data W9, W10 stored in the input buffer 106 at a time to the address of the static random access memory 102 corresponding to the write address signal WAS through the input/output port 1022 according to the shifted extra write command EWRC1.

In Step 822 and Step 824, because the write command WRC4 and the extra read command EREC2 exist simultaneously, the shifter 110 can shift the write command WRC4 to an operation clock behind the extra read command EREC2. Therefore, in Step 826, the input buffer 106 can write the four 8-bit write data W13-W16 stored in the input buffer 106 at a time to the address of the static random access memory 102 corresponding to the write address signal WAS through the input/output port 1022 according to the shifted write command WRC4.

To sum up, the static random access memory system and the operation method thereof utilize the input buffer having size larger than data width of read data and write data and the output buffer having size larger than the data width of the read data and the write data to execute write data operation and read data operation on the static random access memory (only has one input/output port) at different time points, respectively. In addition, because a handshake process does not exist between the input buffer, the output buffer, and the static random access memory, the shifter can shift a write command to an operation clock behind a read command when the write command and the read command exist simultaneously. Therefore, the shifter can prevent the input buffer and the output buffer from executing the write data operation and the read data operation on the static random access memory simultaneously. Thus, compared to the prior art, because the shifter can prevent the input buffer and the output buffer from executing the write data operation and the read data operation on the static random access memory simultaneously, although the static random access memory provided by the present invention only has an input/output port, the present invention can still provide a read data function in time for a user. Therefore, the present invention not only can provide the read data function in time for the user, but can also reduce chip area of the static random access memory significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory system, comprising:
   a static random access memory having a single input/output port;
   an input buffer coupled to the single input/output port for writing write data stored in the input buffer to addresses of the static random access memory corresponding to a write address signal through the single input/output port according to a write command, wherein the single input/output port is between the static random access memory and the input buffer, and the single input/output port is bidirectional;
   an output buffer coupled to the single input/output port for reading read data of addresses of the static random access memory corresponding to a read address signal through the single input/output port according to a read command, and outputting the read data to a host, wherein the single input/output port is between the static random access memory and the output buffer;
   a multiplexer coupled to the static random access memory, the input buffer, and the output buffer for receiving a write enable signal, an enable signal, the write address signal, and the read address signal, transmitting the write address signal and the read address signal to the static random access memory, generating and outputting the write command to the input buffer according to the write enable signal and the enable signal, and generating and outputting the read command to the output buffer according to the enable signal; and
   a shifter coupled to the input buffer and the multiplexer for shifting the write command to an operation clock after the read command when the write command and the read command exist simultaneously.

2. The static random access memory system of claim 1, wherein size of the input buffer and size of the output buffer are at least 2*N bits, size of each write datum stored in the input buffer is N bits, size of each read datum stored in the static random access memory is N bits, and N is a positive integer.

3. The static random access memory system of claim 1, further comprising:
   an extra write/read command generator for generating an extra write command after a last N-bit write datum of a write datum group when a plurality of N-bit write data are comprised in the write datum group, and generating an extra read command before a first N-bit read datum of a read datum group when a plurality of N-bit read data are comprised in the read datum group;
   wherein size of the input buffer and size of the output buffer are at least 4*N bits.

4. The static random access memory system of claim 3, wherein when the extra write command and another read command exist simultaneously, the shifter shifts the extra write command to an operation clock after the another read command.

5. The static random access memory system of claim 3, wherein when another write command and the extra read command exist simultaneously, the shifter shifts the another write command to an operation clock after the extra read command.

6. The static random access memory system of claim 3, wherein when the input buffer receives the extra write command, the input buffer writes the write data stored in the input buffer to the addresses of the static random access memory corresponding to the write address signal according to the extra write command.

7. The static random access memory system of claim 3, wherein when the output buffer receives the extra read command, the output buffer reads the read data of the addresses of the static random access memory corresponding to the read address signal according to the extra read command, and outputs the read data to the host.

8. The static random access memory system of claim 3, wherein the write datum group and the read datum group are applied to an error correction engine decoder.

9. An operation method of a static random access memory system, wherein the static random access memory system comprises a static random access memory, a multiplexer, an input buffer, an output buffer, and a shifter, wherein the static random access memory has a single input/output port, the single input/output port is between the static random access memory and the input buffer, the single input/output port is between the static random access memory and the output buffer, and the single input/output port is bidirectional, the operation method comprising:
   the multiplexer receiving a write enable signal, an enable signal, a write address signal, and a read address signal;
   the multiplexer transmitting the write address signal and the read address signal to the static random access memory, generating and outputting a write command to the input buffer according to the write enable signal and the enable signal, and generating and outputting a read command to the output buffer according to the enable signal;
   the input buffer writing write data stored in the input buffer to addresses of the static random access memory corresponding to the write address signal through the single input/output port according to the write command;
   the output buffer reading read data of addresses of the static random access memory corresponding to the read address signal through the single input/output port according to the read command, and outputting the read data to a host; and
   the shifter shifting the write command to an operation clock after the read command when the write command and the read command exist simultaneously.

10. The operation method of claim 9, wherein size of the input buffer and size of the output buffer are at least 2*N bits, size of each write datum stored in the input buffer is N bits, size of each read datum stored in the static random access memory is N bits, and N is a positive integer.

11. The operation method of claim 9, further comprising:
   an extra write/read command generator comprised in the static random access memory system generating an extra write command after a last N-bit write datum of a write datum group when a plurality of N-bit write data are comprised in the write datum group; and
   the extra write/read command generator generating an extra read command before a first N-bit read datum of a read datum group when a plurality of N-bit read data are comprised in the read datum group;
   wherein size of the input buffer and size of the output buffer are at least 4*N bits.

12. The operation method of claim 11, wherein when the extra write command and another read command exist simultaneously, the shifter shifts the extra write command to an operation clock after the another read command.

13. The operation method of claim 11, wherein when another write command and the extra read command exist simultaneously, the shifter shifts the another write command to an operation clock after the extra read command.

14. The operation method of claim 11, further comprising:
   the input buffer writing the write data stored in the input buffer to the addresses of the static random access memory corresponding to the write address signal according to the extra write command when the input buffer receives the extra write command.

15. The operation method of claim 11, further comprising:
   the output buffer reading the read data of the addresses of the static random access memory corresponding to the read address signal according to the extra read command and outputting the read data to the host when the output buffer receives the extra read command.

* * * * *